United States Patent [19]

Ling

[11] Patent Number: 5,576,680
[45] Date of Patent: Nov. 19, 1996

[54] STRUCTURE AND FABRICATION PROCESS OF INDUCTORS ON SEMICONDUCTOR CHIP

[75] Inventor: Peiching Ling, San Jose, Calif.

[73] Assignee: Amer-Soi, Sunnyvale, Calif.

[21] Appl. No.: 203,991

[22] Filed: Mar. 1, 1994

[51] Int. Cl.$^6$ ............................................. H01F 5/00
[52] U.S. Cl. ............................................................... 336/200
[58] Field of Search .................................. 336/200, 223

[56] References Cited

U.S. PATENT DOCUMENTS

| | | | |
|---|---|---|---|
| 3,731,005 | 5/1973 | Shearman | 179/100.2 C |
| 3,881,244 | 5/1975 | Kendall | 29/602 |
| 4,117,588 | 10/1978 | Johnson | 29/608 |
| 4,649,755 | 3/1987 | Volz | 73/861.78 |
| 4,729,510 | 3/1988 | Landis | 333/162 |
| 5,372,967 | 12/1994 | Sundaram et al. | 437/60 |

Primary Examiner—Laura Thomas
Attorney, Agent, or Firm—Bo-In Lin

[57] ABSTRACT

The present invention discloses an inductive circuit. The inductive circuit is fabricated on a semiconductor chip including a substrate layer and a dielectric layer. The inductive circuit includes an inductive core composed of high magnetic susceptible material (HMSM) surrounded by an dielectric layer. The dielectric layer which surrounds the inductive core is further surrounded by a conductive line which includes the bottom conductive lines the conductive lines in the 'vias' through the surrounding dielectric layer and the top conductive lines. The conductive lines are patterned by employing IC fabrication processes. Thus the inductive core, the dielectric layer surrounding the inductive core, and the surrounding conductive line form an inductive circuit and the inductive circuit is formed on the semiconductor chip which includes the substrate a layer and a dielectric layer.

23 Claims, 17 Drawing Sheets

STRUCTURE AND FABRICATION PROCESS OF INDUCTORS ON SEMICONDUCTOR CHIP

BACKGROUND OF THE INVENTION

1. Field of the Invention

This invention relates generally to the structure and fabrication process of the integrated circuits (ICs). More particularly, this invention relates to the structure and fabrication process of implementing the inductive circuits as part of the integrated circuits (ICs) which have line-width in the range of a micron or sub-mircons such the the inductive circuit can be fully integrated and be regularly employed as an IC circuit element.

2. Description of the Prior Art

Even though the electronic circuits are continuously being miniaturized through the progress made in the very large system integration (VLSI) and the ultra-large system integration (ULSI) fabrication technology, the integrated circuit (IC) technology is yet limited by a great difficulty that the inductive circuits are still not suitable for IC implementation. This difficulty arises due to the fact that the IC fabrication techniques are mostly 'layer-oriented' which typically involve processes which are applied to multiple horizontal surfaces in a sequential fashion. However, the inductive circuit has a 'non-planar' configuration which typically has a continuous spiral shape. This particular non-planar configuration thus prevents the IC fabrication process to integrate the inductive circuits as part of the IC devices.

This technical difficulty severely limits the application scope of the IC technology. The inductive circuits are broadly used in various filters, oscillators, resonators, transformers, and many other control circuits for applications in communication signal generation and processing, energy storage, and electric static discharge (ESD) or electric over stress (EOS) protections. This limitation of not able to integrate the inductive circuit on an IC chip greatly hinders the technical progress in these fields. As will be discussed below, the traditional design and fabrication techniques for devices involve inductive circuits are still being applied without much progress for many decades. Such a difficulty further prevents all the devices which incorporate inductive circuits from being benefited from the IC fabrication technology. Thus the devices which requires the use of inductive circuits all tends to have large volume and more costly compared to the IC fabricated devices due to the facts that they cannot be miniaturized and mass-produced by the use of the highly precise and efficient IC fabrication technology.

In U.S. Pat. No. 4,783,646 entitled 'Stolen Article Detection Tag Sheet, and Method for Manufacturing the Same' (issued on Nov. 8, 1988), Matsuzaki discloses a stolen article detection tag sheet. The tag sheet includes a transmitting antenna section, a receiving antenna section and an inductor section connected in series between the receiving and the transmitting antenna section. The tag sheet further includes a semi-conductor diode chip having a semiconductor substrate mounted on and electrically connected to a first portion of the inductor section and a Schottky barrier electrode formed on top of the substrate. The tag sheet further includes a second conductive pattern which is formed in contact with the conductive member of the Schttoky barrier electrode. The semiconductor chip diode and the inductor section are connected in parallel to each other to constitute an LC resonator and the frequency of the resonator is determined by the parasitic capacitance of the diode and the inductance which is 2.4 nH in this particular tag sheet.

Matzusaki discloses a method to implement an LC resonating circuit on a print circuit (PC) board. However, as Matzusaki's technique discloses a configuration to fabricate an LC circuit, wherein inductance is generated together with a parasitic capacitance by connecting a conductive line in parallel with the electrode of a diode, it does not teach a method to fabricate an inductor alone on the integrated circuit (IC) chips. Furthermore, since the size of the resonator as disclosed by Matzusaki is in the range of few hundred microns (μm), the technique and device configuration disclosed by Matzusaki are not applicable for fabrication of IC devices with line width of few microns or in the sub-micron range.

In another U.S. Pat. No. 4,841,253 entitled 'Multiple spiral Inductors for DC Biasing of An Amplifier' (issued on Jun. 20, 1989), Crabill discloses a monolithic semiconductor having an on-chip DC biasing which includes a plurality of series connected spiral inductors connected between respective biasing and the semi-conductor circuit. As shown in FIGS. 1, 2 and 3, the inductive means as claimed in this Patent, including these spiral inductors are external off-chip components. These type of inductive circuits, due to the particular configuration of expanding as a spiral on a horizontal plane, tend to occupy large IC chip areas and therefore not suitable for compact IC integration, especially for very large scale integration (VLSI). Furthermore, since the plane configuration, the inductance which can be provided by this flat spiral inductor is very limited. The application of the conductors as disclosed and used in Crabill's invention is therefore quite limited.

Other than the spiral inductors as discussed above, the state of the art in utilizing an inductive circuit in various devices can be illustrated by referencing to the U.S. Pat. No. 4,800,32, entitled 'Single Ended Self-Oscillating DC-DC Converter for Intermittently Energized Load Having $V_{BE}$ Responsive Current Limit Circuit' (issued on Jan. 24, 1989) by Sikora, or another U.S. Pat. No. 4,845,580 entitled 'AC DC Spike Eliminating Bandpass Filter' (issued on Jul. 4, 1989) by Kitchen. The inductive circuits as disclosed in these Patents are still introduced as wire-winding circuit components. These inductive circuits obviously cannot be implemented on an IC chip as part of an IC device.

Therefore, there is still a need in the art of IC device fabrication, particularly for the electronic devices which require the use of the inductive circuits, to provide a structure and fabrication process that would resolve these limitations.

SUMMARY OF THE PRESENT INVENTION

It is therefore an object of the present invention to provide a structure and fabrication process of an inductive circuit on an IC chip to overcome the aforementioned difficulties encountered in the prior art.

Specifically, it is an object of the present invention to provide an IC structure and fabrication process such that an inductive circuit can be integrated thereon.

Another object of the present invention is to provide an IC structure and fabrication method to integrate an inductive circuit as part of the IC device such that the dimensions of the inductive device can be reduced to a range comparable to the VLSI or ULSI line-widths.

Another object of the present invention is to provide an IC structure and fabrication method to integrate an inductive circuit as part of the IC device such that the electrical devices which incorporate the inductive circuits can be miniaturized and mass produced by the use of IC fabrication processes.

Another object of the present invention is to provide an IC structure and fabrication method to integrate an inductive circuit as part of the IC device such that the fabrication quality of the electrical devices which incorporate the inductive circuits can be improved by the use of IC fabrication processes.

Another object of the present invention is to provide an IC structure and fabrication method to integrate an inductive circuit as part of the IC device whereby the performance levels such as the speed, the precision of control or other operational characteristics of the electrical devices which incorporate the inductive circuits can be improved because of the better design and higher fabrication quality provided by the IC technology.

Briefly, in a preferred embodiment, the present invention comprises an inductor circuit. The inductive circuit is fabricated on a semiconductor chip including a substrate layer and a dieletric layer. The inductive circuit includes an inductive core composed of high magnetic susceptible material (HMSM) surrounded by an dielectric layer. The dielectric layer which surrounds the inductor core is further surrounded by a conductive line which includes the bottom conductive lines the conductive lines in the 'vias' through the surrounding dielectric layer and the top conductive lines. The conductive lines are patterned by employing IC fabrication processes. Thus the inductive core, the dielectric layer surrounding the inductive core, and the surrounding conductive line form an inductive circuit and the inductive circuit is formed on the semi-conductor chip which includes the substrate a layer and a dieletric layer.

It is an advantage of the present invention that it provides an IC structure and fabrication method to integrate an inductive circuit as part of the IC device such that the dimensions of the inductive device can be reduced to a range comparable to the VLSI or ULSI line-widths.

Another advantage of the present invention is that it provides an IC structure and fabrication method to integrate an inductive circuit as part of the IC device such that the electrical devices which incorporate the inductive circuits can be miniaturized and mass produced by the use of IC fabrication processes.

Another advantage of the present invention is that it provides an IC structure and fabrication method to integrate an inductive circuit as part of the IC device such that the fabrication quality of the electrical devices which incorporate the inductive circuits can be improved by the use of IC fabrication processes.

Another advantage of the present invention is that it provides an IC structure and fabrication method to integrate an inductive circuit as part of the IC device whereby the performance levels such as the speed, the precision of control or other operational characteristics of the electrical devices which incorporate the inductive circuits can be improved because of the better design and higher fabrication quality provided by the IC technology.

These and other objects and advantages of the present invention will no doubt become obvious to those of ordinary skill in the art after having read the following detailed description of the preferred embodiment which is illustrated in the various drawing figures.

DETAILED DESCRIPTION OF THE PREFERRED EMBODIMENT

Figure 1A:
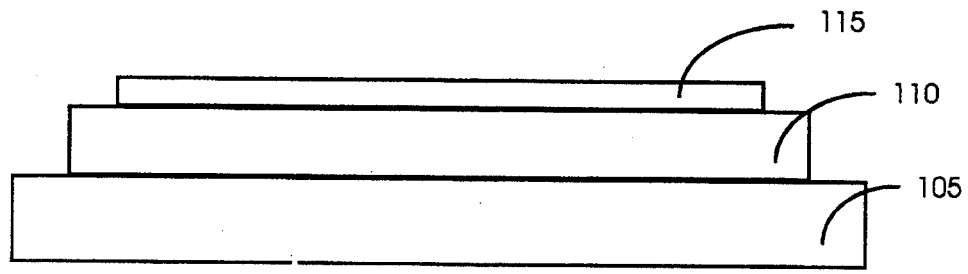
FIGS. 1A to 1K are a sequence of cross-sectional views, top views and partial perspective views showing the processing steps employed by the present invention for fabricating an inductive circuit.
Figure 1B:
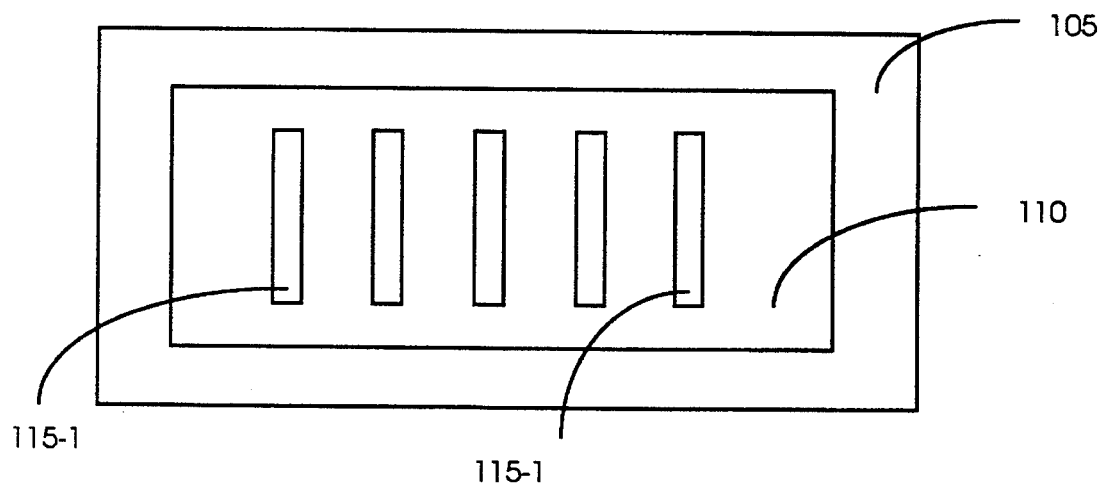
Figure 1C:
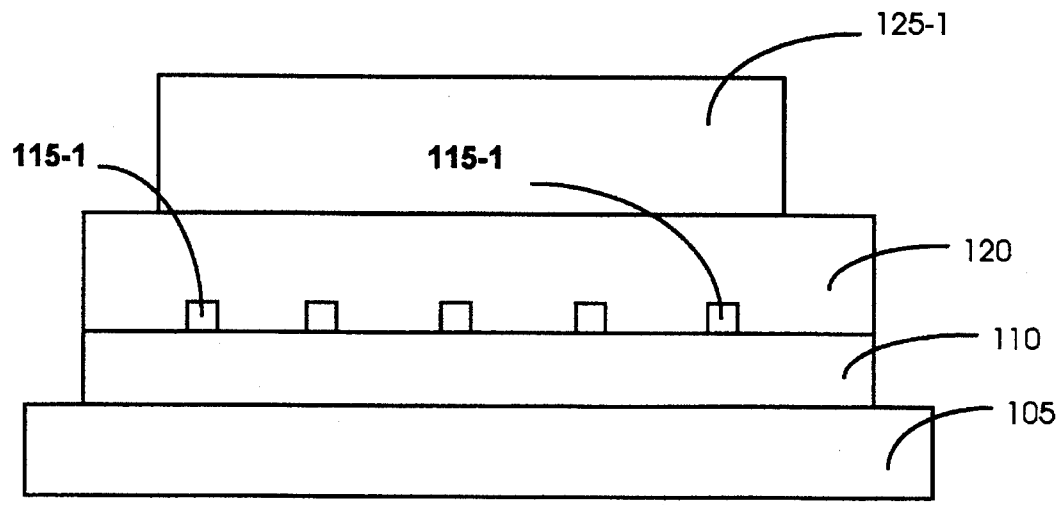
Figure 1D:
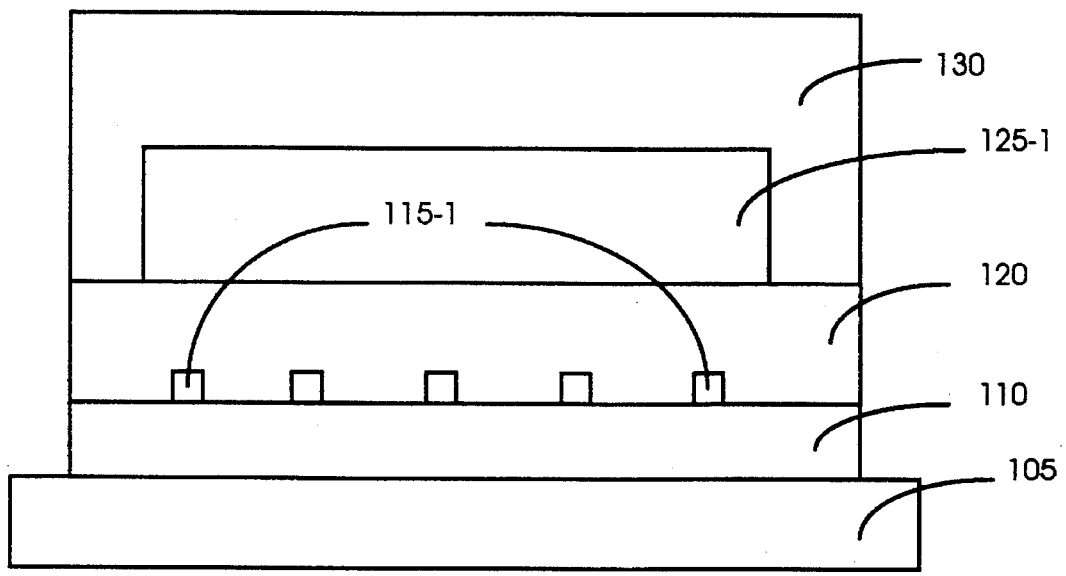
Figure 1E:
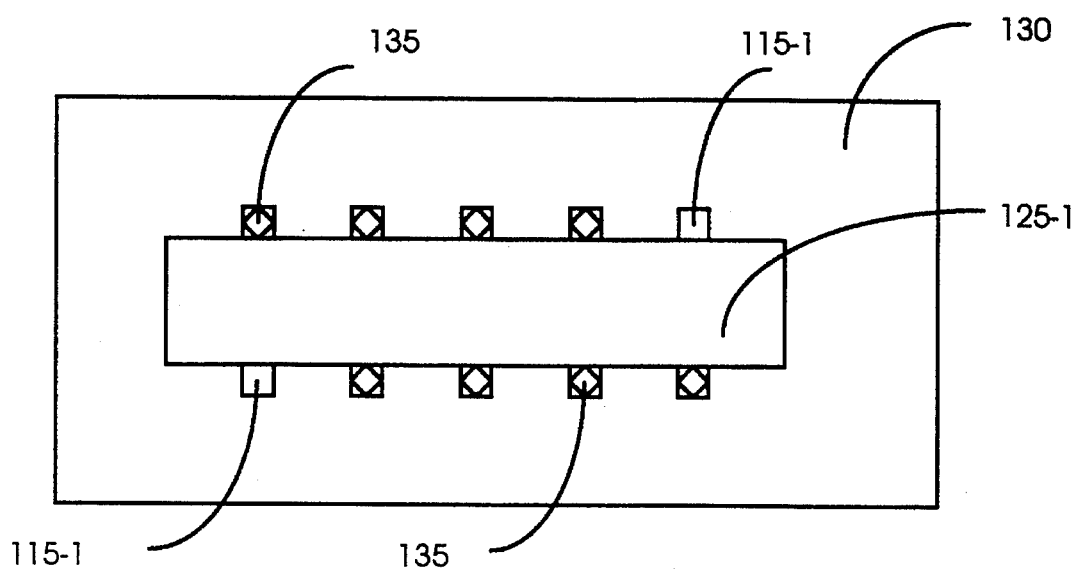
Figure 1F:
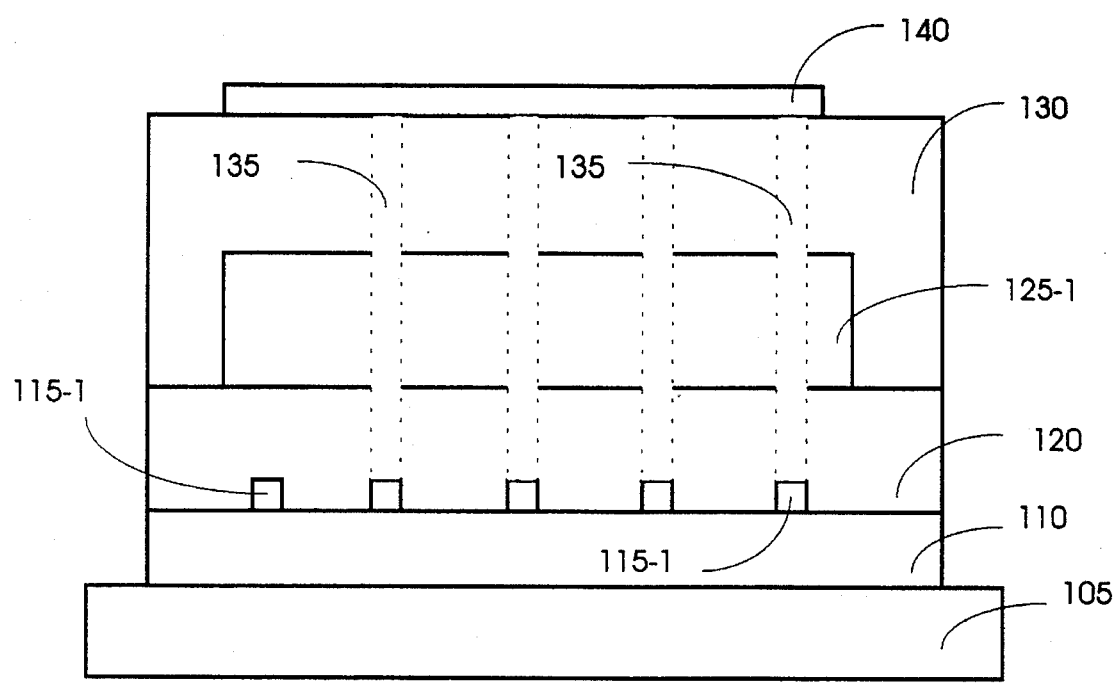
Figure 1G:
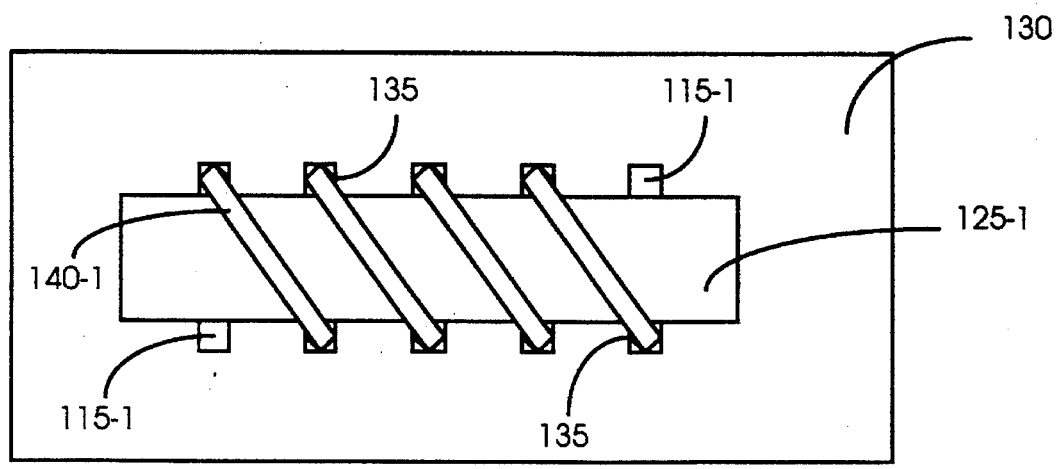

FIGS. 1A to 1G show the processing steps for fabricating an IC inductive circuit 100. FIG. 1A shows a substrate 105 which supports a dielectric layer 110 on the top surface of the substrate 105. A conductive layer 115 is deposited on the top of the dielectric layer 110. The conductive layer 115 is then patterned to form the bottom conductive lines 115-1 by a process of etching or other IC processing steps, e.g., by the use of a photo-lithography technique. FIG. 1B shows a top view of the patterned bottom conductive lines 115-1 on top of the dielectric layer 110. FIG. 1C shows a second dielectric layer 120 is formed on top of the bottom conductive lines 115-1. A high magnetic susceptible material (HMSM) layer 125 is then deposited on top of the dielectric layer 120. The HMSM layer 125 is then etched to form an inductor core 125-1. FIG. 1D shows the next step of depositing another layer of dielectric layer 130 on top of the inductor core 125-1. A plurality of 'vias' 135, i.e., small pin holes 135, are formed through the dielectric layers as that shown in FIG. 1E wherein each 'via' is filled with a conductive material to be in electric contact with the bottom conductive lines 115-1 as that shown in FIG. 1E. FIG. 1F shows that another layer of conductive layer 140 is formed on top of the dielectric layer 130 and the conductive layer 140 is further etched and patterned to form the top conductive lines 140-1 as that shown in FIG. 1G wherein each of the top conductive lines connecting two vias thus forming a circuit surrounding the HMSM inductor core 125-1. Another layer of dielectric layer 150 is then formed on top of the top conductive lines 140-1 to to form a passivation and insulation layer 150 for protecting the entire inductor circuit 100.

Figure 1H:
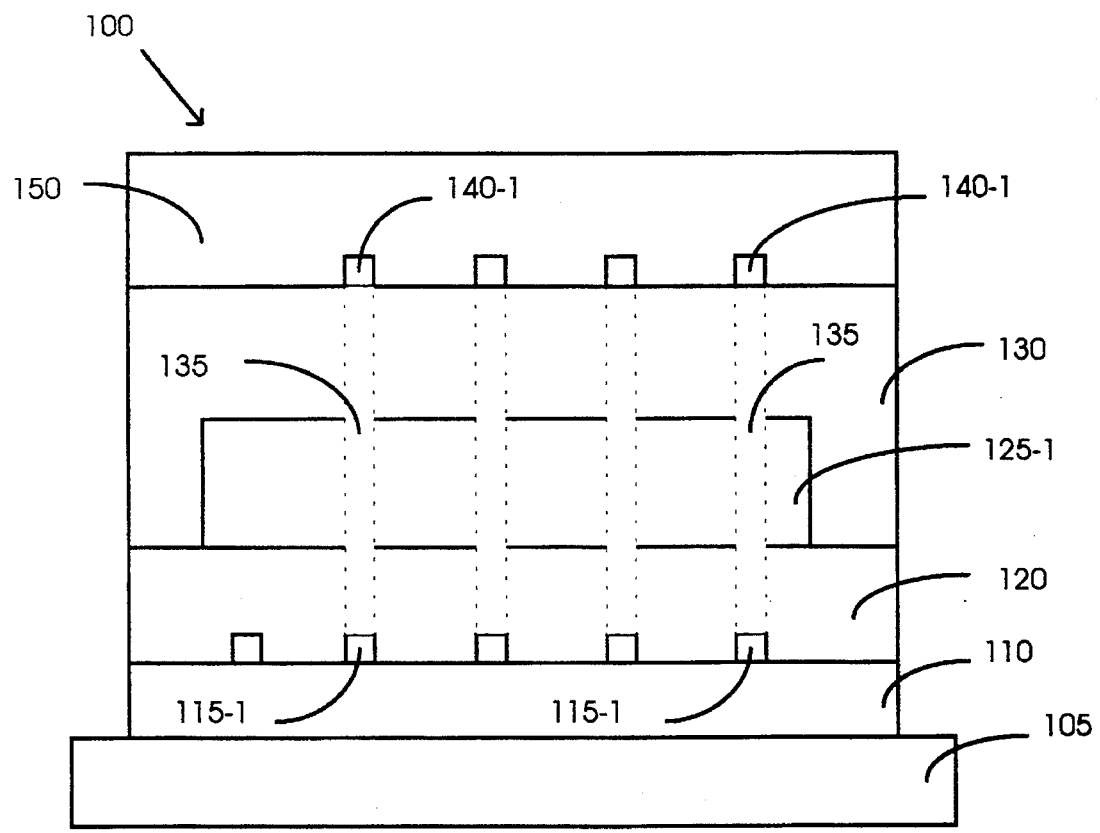
Figure 1I:
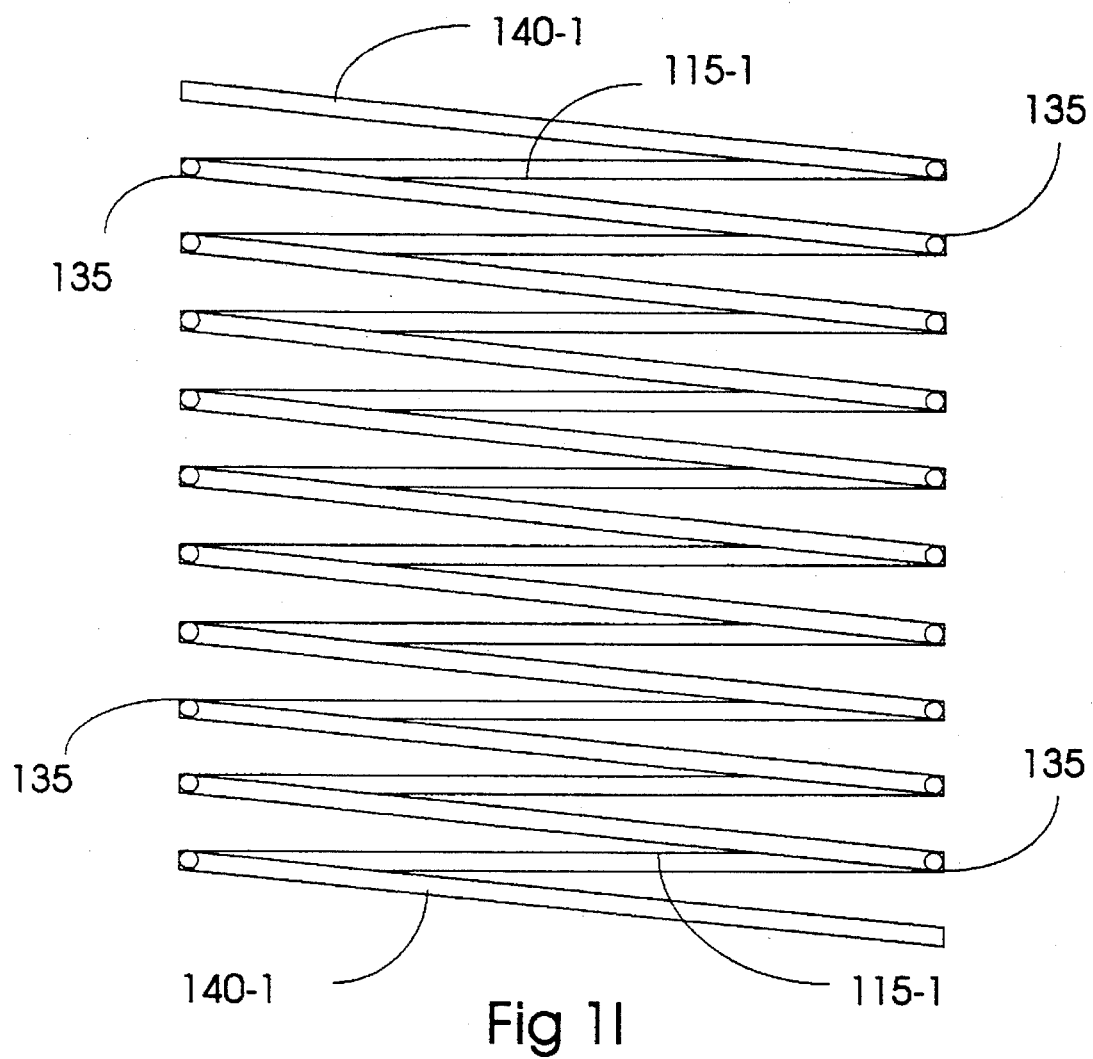
Figures 1, 1I:
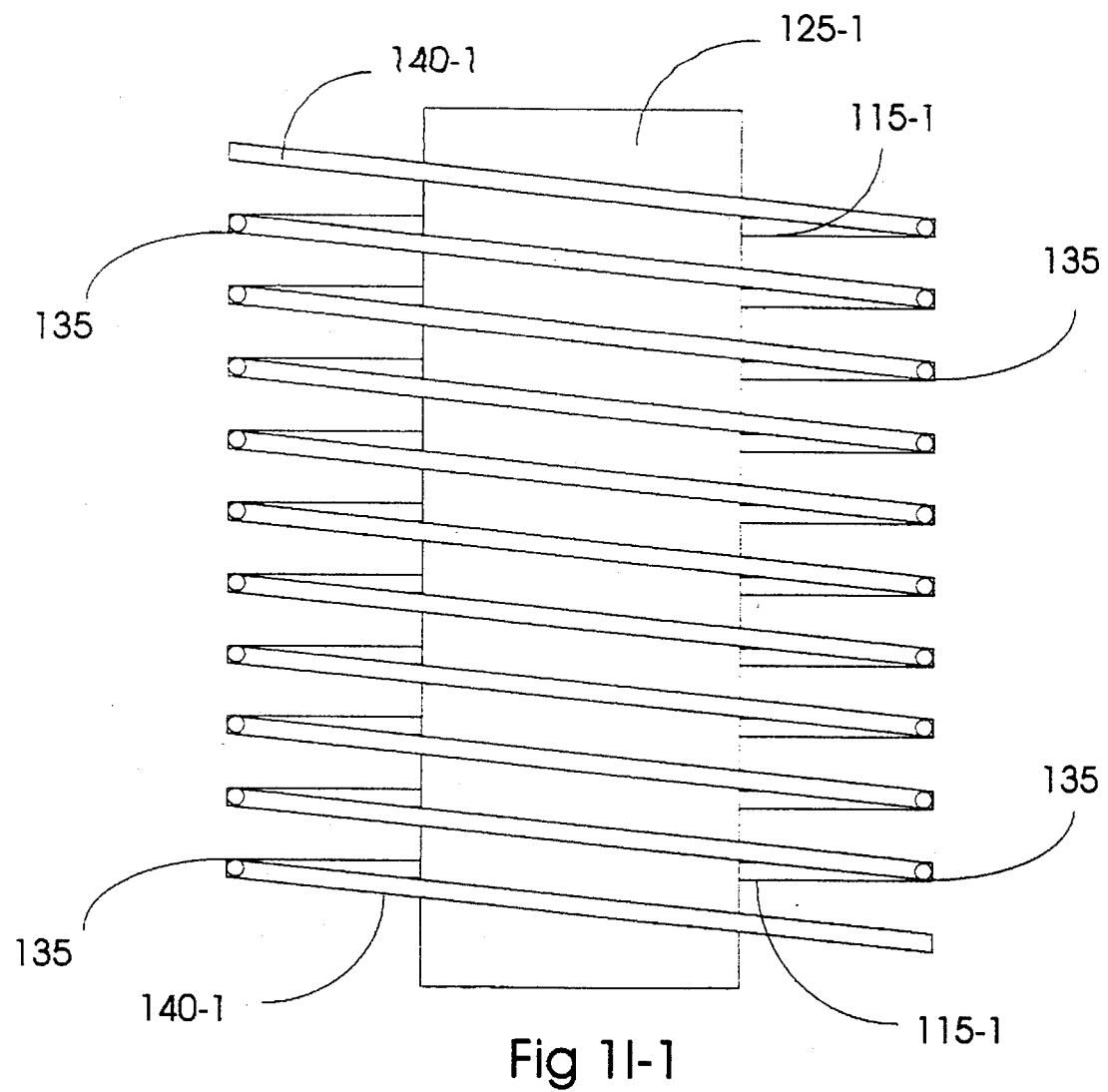
Figure 1J:
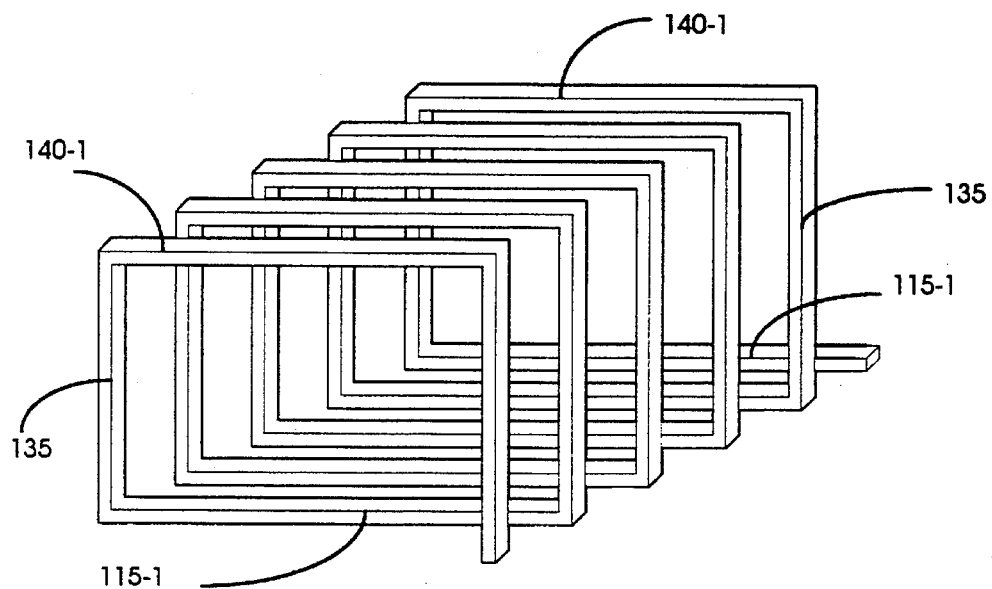

In order to more clearly show the configuration of the inductive circuit 100, FIGS. 1I, 1I', and 1J show the top views and a perspective side view of the inductive line formed by connecting the bottom inductive lines 115-1 and the top inductive lines 140-1 by the use of the via-connecting lines 135. FIG. 1I' shows the inductive circuit 100 including the inductive core 125-1 while FIG. 1I shows the inductive circuit 100 without the inductive core. This three-dimensional multi-planar configuration of the conductive line employed for the formation of the inductive circuit 100 thus provides an IC circuit designer a technique to circumvents the limitation of the traditional layer-oriented IC design concept.

Figure 1K:
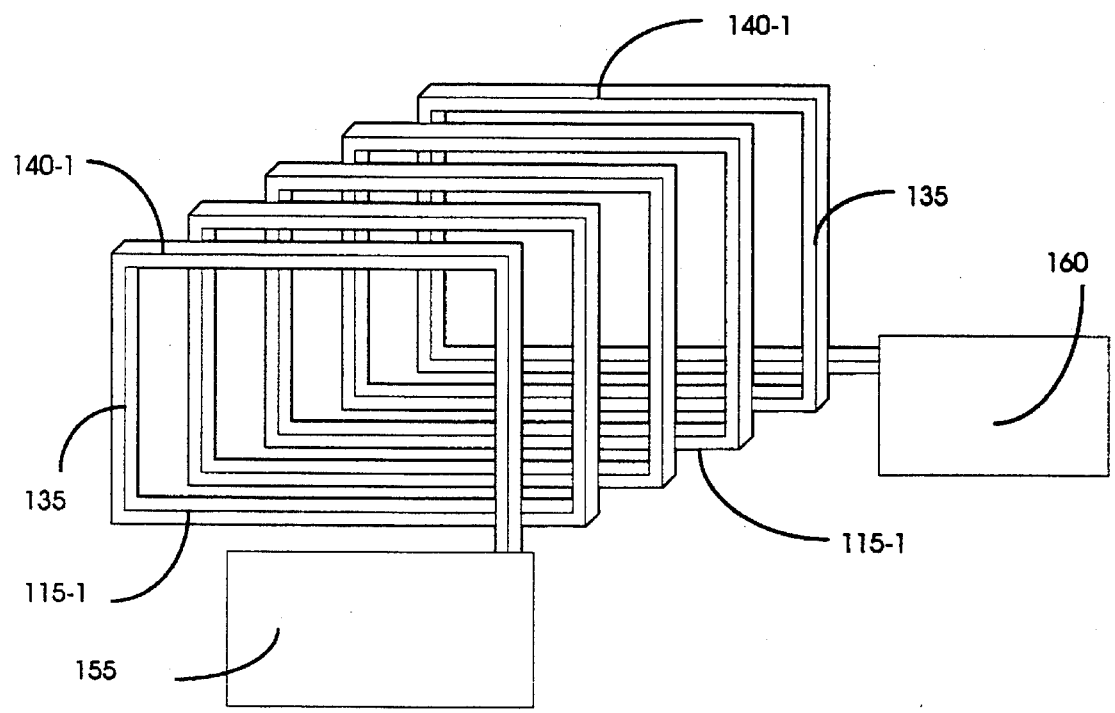

FIG. 1K shows a perspective view of the inductive circuit 100 used for ESD protection wherein one end of the conductive line is connected to the internal circuitry 155 while the other end is connected to a bonding pad 160 to allow discharge of the excessive current generated due to static discharge. In response to static discharge, an inductive voltage and current is generated by the inductive circuit 100, i.e.,the connected inductive lines 115-1, 135, and 140-1, which can prevent instant high voltage and current to be discharged in the internal circuitry 155 whereby damages caused by either ESD or EOS can be minimized.

An integrated-circuit (IC) inductive circuit 100 fabricated on a semiconductor chip 105 is disclosed in the present invention. The IC inductive circuit 100 comprises an inductive line formed by connecting a plurality of conductive lines, e.g., conductive lines 115-1 and 140-1, which are disposed on several layers, e.g., the top surface layer and the bottom surface layer, in the semiconductor chip by utilizing a plurality of via-connecting lines 135 penetrating between the several layers in the semiconductor chip 105 thus forming an IC inductive coil in the semiconductor chip 105. The inductive line disposed on several layers and the plurality of via-connecting lines are fabricated by IC processes on the semiconductor chip 105.

FIG. 1H thus shows a preferred embodiment of the present invention which comprises an inductor circuit 100. The inductive circuit 100 is fabricated on a semiconductor chip including a substrate layer 105 and a dieletric layer 110. The inductive circuit 100 includes an inductive core 125-1 composed of high magnetic susceptible material (HMSM) surrounded by an dielectric layer including the dielectric layers 120 and 130. The dielectric layer, i.e., layers 120 and 130, surrounding the inductor core 125-1 is further surrounded by a conductive line which includes the bottom conductive lines 115-1, the conductive lines in the 'vias' 135, and the top conductive lines 140-1. The conductive lines are patterned by employing IC fabrication processes. Thus the inductive core 125-1, the dielectric layer (layers 120 and 130) surrounding the inductive core 125-1, and the surrounding conductive line (lines 115-1, 135, and 140) form an inductive circuit 100. The inductive circuit 100 is formed on the semi-conductor chip which includes the substrate layer 105 and the dieletric layer 110.

FIG. 1K also shows a preferred embodiment of the present invention wherein the inductive coil of the integrated inductive circuit 100 is further connected to an internal circuit 155 and a bonding pad 160 disposed on the semiconductor chip 105 for protecting the internal circuit 155 from being damaged by electric static discharge (ESD) or electric over stress (EOS).

FIGS. 1A to 1K also discloses a method for fabricating an integrated inductive circuit 100 on a substrate 105 by employing IC fabrication processes comprising the steps of: (a) forming and patterning a three layer structure on the substrate 105 including a plurality of bottom inductive lines 115-1, a plurality of top inductive lines 125-1, and an inductive core 120 composed of high magnetic susceptible material (HMSM), the inductive core 120 being insulated from and formed between the top-inductive and the bottom inductive lines 115-1 and 125-1; and (b) forming a plurality of connecting means 135 through the inductive core for connecting each of the top inductive lines 115-1 to a corresponding bottom inductive line 125-1 forming a combined inductive line surrounding the inductive core 120 for conducting an inductive electric current therein for generating an inductive magnetic field in the inductive core 120. In a preferred embodiment, the step (a) for forming and patterning the three layer structure and the step (b) of forming the connecting means in the aforementioned method for fabricating the integrated inductive circuit 100 utilize the IC fabrication processes whereby the integrated inductive circuit 100 is fabricated with a linewidth of approximately one micron or less.

Figure 2A:
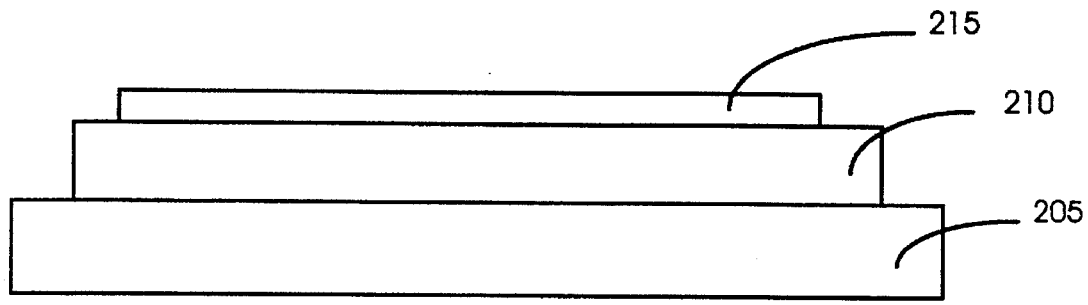
FIGS. 2A to 2E are a sequence of cross-sectional views or top views showing the processing steps employed by the present invention for fabricating another inductive circuit.
Figure 2B:
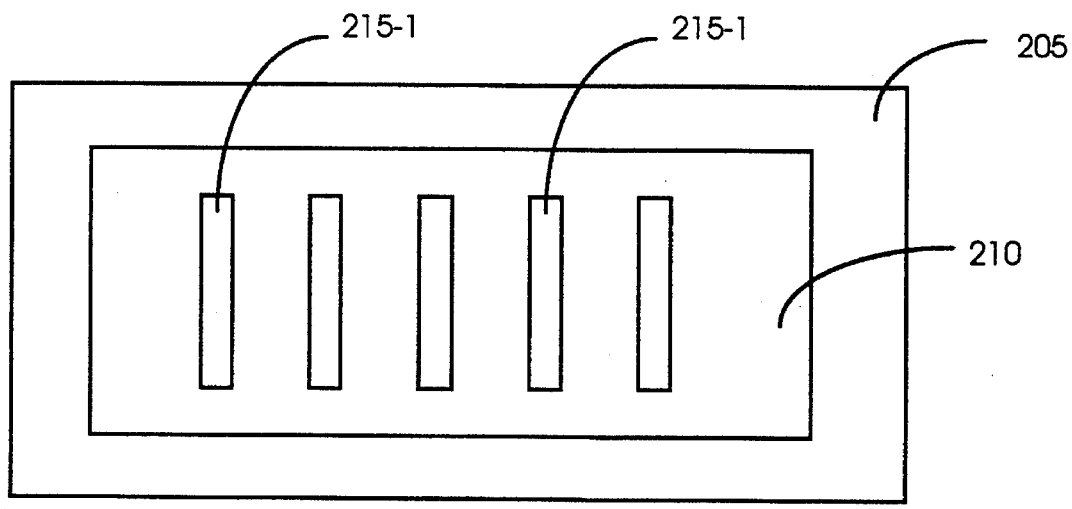
Figure 2C:
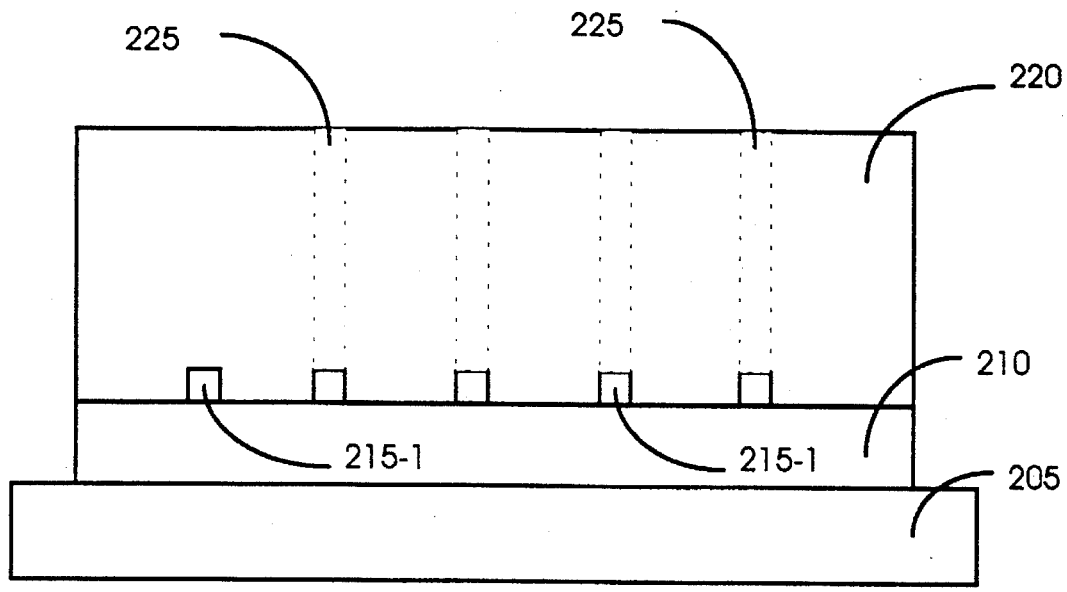
Figure 2D:
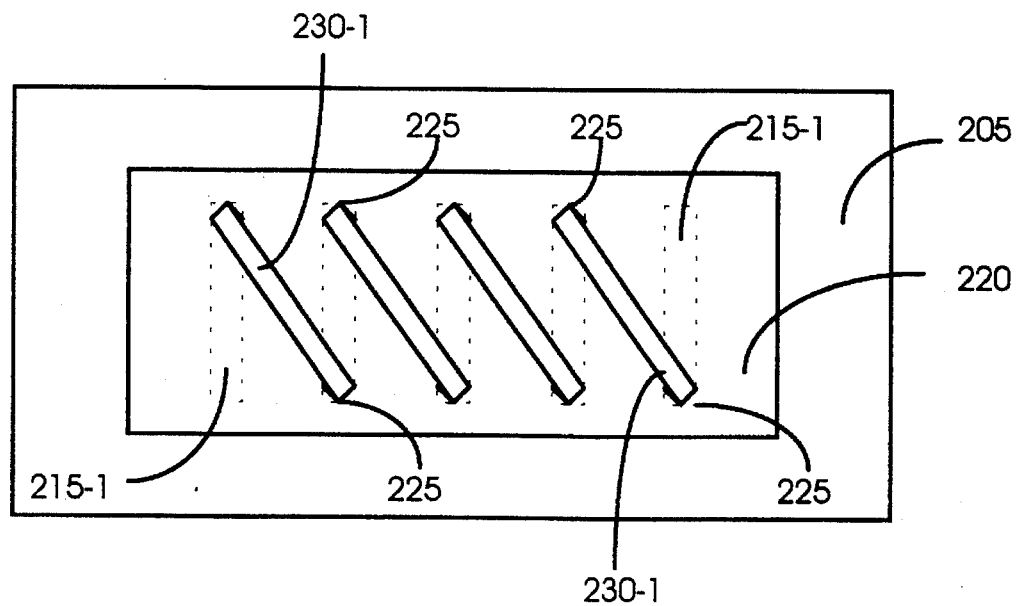
Figure 2E:
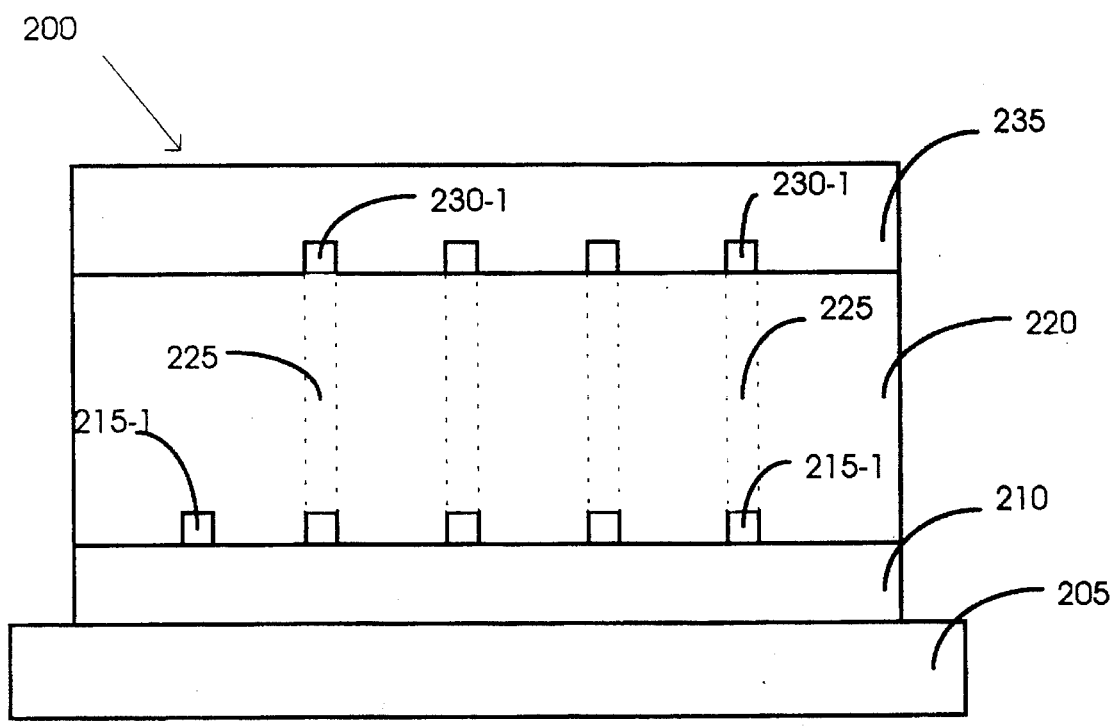

FIGS. 2A to 2E show another sequence of processing steps for making an inductive circuit 200 on an IC chip. FIG. 2A shows an IC chip includes a substrate 205 which may be a semiconductor such as a silicon substrate, and a layer of high magnetic susceptible material 210 which is first deposited on the top surface of the substrate 205. A conductive layer 215 is then deposited on top of this HMSM layer 210. This conductive layer 215 is then patterned by an IC processing step, such as etching, to form a bottom portion of the inductor lines 215-1. FIG. 2B shows the top view of these bottom inductor lines 215-1. FIG. 2C shows another layer of high magnetic susceptible material 220 is deposited on top of the bottom inductor lines 215-1. A plurality of 'vias' 225 are formed through the HMSM layer 220 and each via is then filled with conductive material to contact with the bottom inductor lines 215-1. Another layer of conductive layer 230 is formed on top of the HMSM layer 225 and then patterned to form plurality of top inductor lines 230-1 in electric contact with the vias as shown in FIG. 2D. Then another layer of HMSM layer 235 is deposited on top of the top inductor lines 230-1 to complete the structure of an inductor 200 as shown in FIG. 2E which has the inductor lines including the bottom inductor lines 215-1, the via inductor lines 225, and the top inductor lines 230 surrounded by the HMSM layers including the HMSM layers 210, 220, and 235. The precessing steps and the inductor structure are particularly useful for an inductive core where a non-conductive high magnetic susceptible material is used and very effective in generating high inductance in a very small volume where IC technology is used for fabricating the inductive circuit on an IC chip.

FIG. 2E thus discloses an IC inductive circuit which is fabricated on a semiconductor chip. The IC inductive circuit comprises an inductive core composed of high magnetic susceptible material (HMSM), including the layers 210, 220, and 235. The inductive circuit further has at least an inductive line, the inductive line combined by the bottom inductive lines 215-1 and the top inductive lines 230-1. The inductive line is disposed near the inductive core for conducting an inductive electric current therein for generating an inductive magnetic field in the inductive core. The inductive core and the inductive line being fabricated by IC processes on the IC chip, i.e., on the substrate 205. By the use of IC fabrication processes, the inductive core and the inductive line as shown in FIG. 2E are of a linewidth approximately one micron or less which is suitable for integrated on an IC device fabricated by the VLSI technology.

FIGS. 2A to 2E also disclose a method for fabricating an integrated inductive circuit 200 on a substrate 205 by employing IC fabrication processes comprising the steps of: (a) forming and patterning a five layer structure on the substrate 205 including (i) a bottom inductive core layer 210 composed of a high magnetic susceptible material (HMSM), (ii) a plurality of bottom inductive lines 215-1 on the bottom HMSM layer 210, (iii) an intermediate layer 220 above the bottom inductive lines 215-1, (iv) a plurality of top inductive lines 230-1 on the intermediate layer 220, and (v) an inductive core layer 235 composed of high magnetic susceptible material (HMSM), the top and bottom inductive core layers 210 and 230 and the intermediate layer 220 being insulated from the top-inductive and the bottom inductive lines 215-1 and 230-1; and (b) forming a plurality of connecting means 225 through the intermediate layer 220 for connecting each of the top inductive lines 230-1 to a corresponding bottom inductive line 215-1 forming a combined inductive line inside a volume contained in the top and bottom inductive core layers 210 and 235 for conducting an inductive electric current therein for generating an inductive magnetic field in the inductive core layers 210 and 235. In a preferred embodiment, the step (a) for forming and patterning the five layer structure and the step (b) of forming the connecting means 225 utilizing the IC fabrication processes whereby the integrated inductive circuit 200 is fabricated with a linewidth of approximately one micron or less. In another preferred embodiment, the step (a) for forming the intermediate layer is a step of forming the intermediate layer by using a high magnetic susceptible material (HMSM) for fabricating the integrated inductive circuit 200. In another preferred embodiment, the step (a) for forming the top and bottom inductive core layers and the intermediate layer is a step of forming the layers by using materials composed of non-conductive high magnetic susceptible materials for fabricating the integrated inductive circuit 200.

Figure 3A:
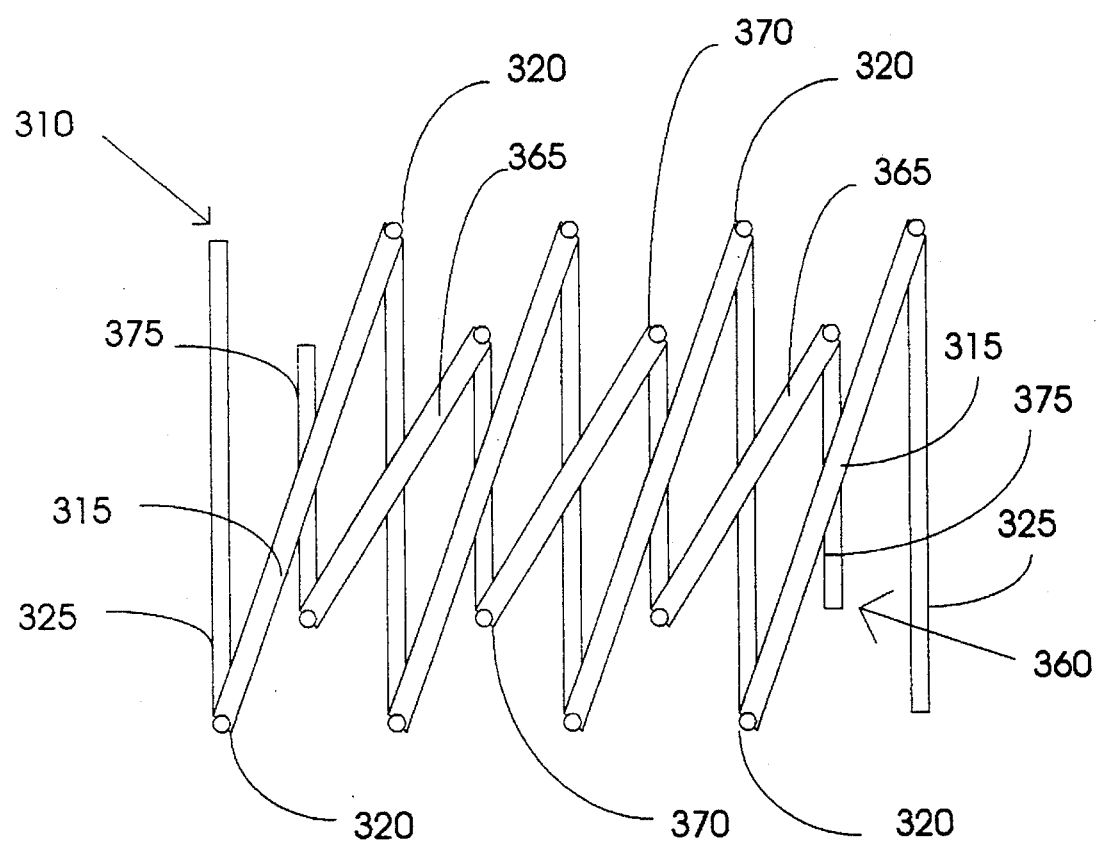
FIG. 3A to 3D shows combinations of different inductive circuits formed on multiple horizontal planes on an IC chip.
Figure 3B:
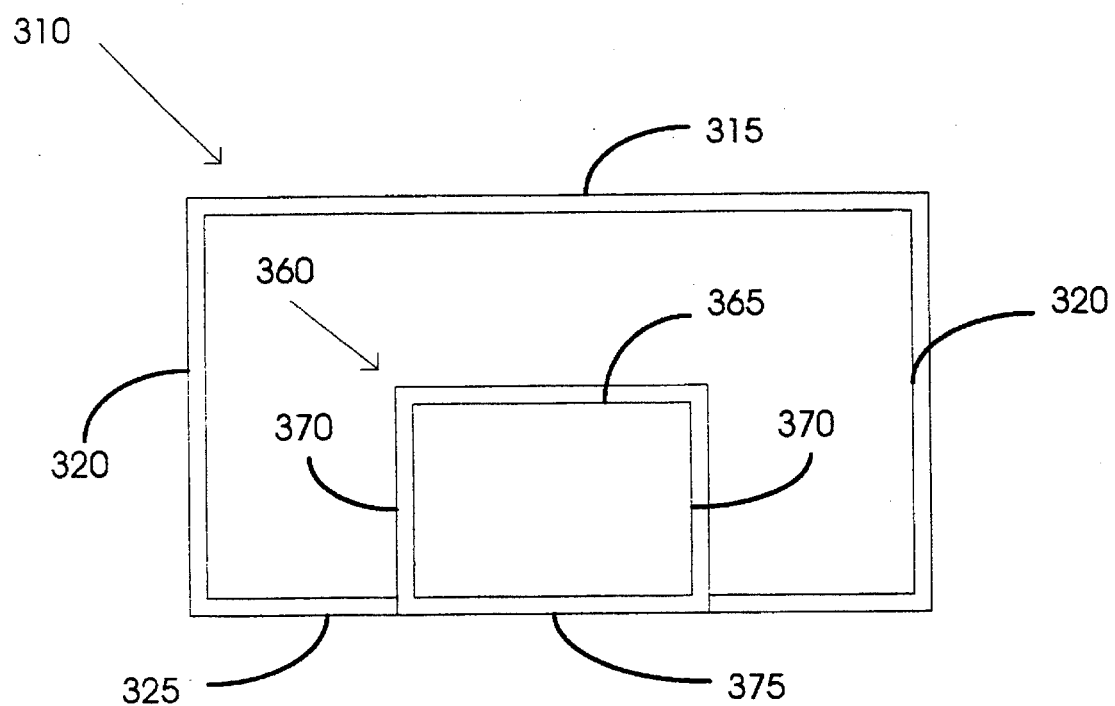
Figure 3C:
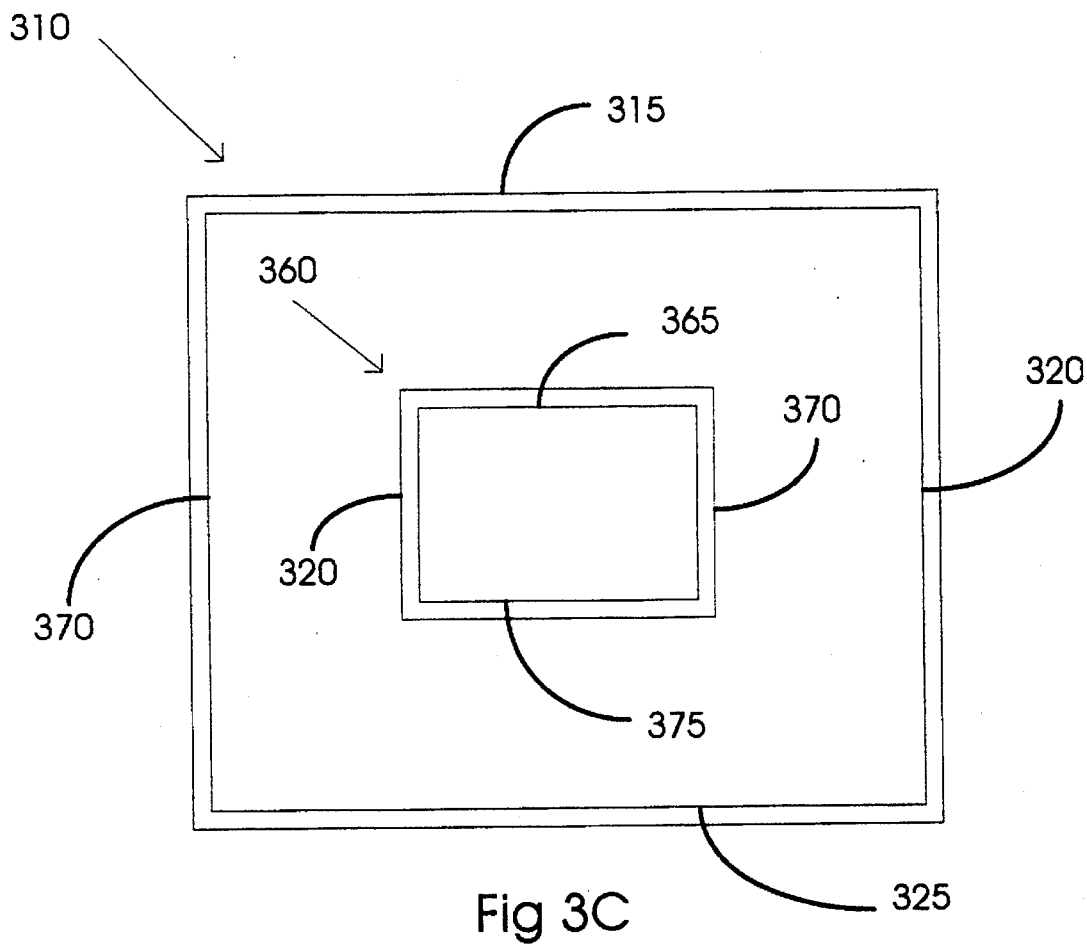
Figure 3D:
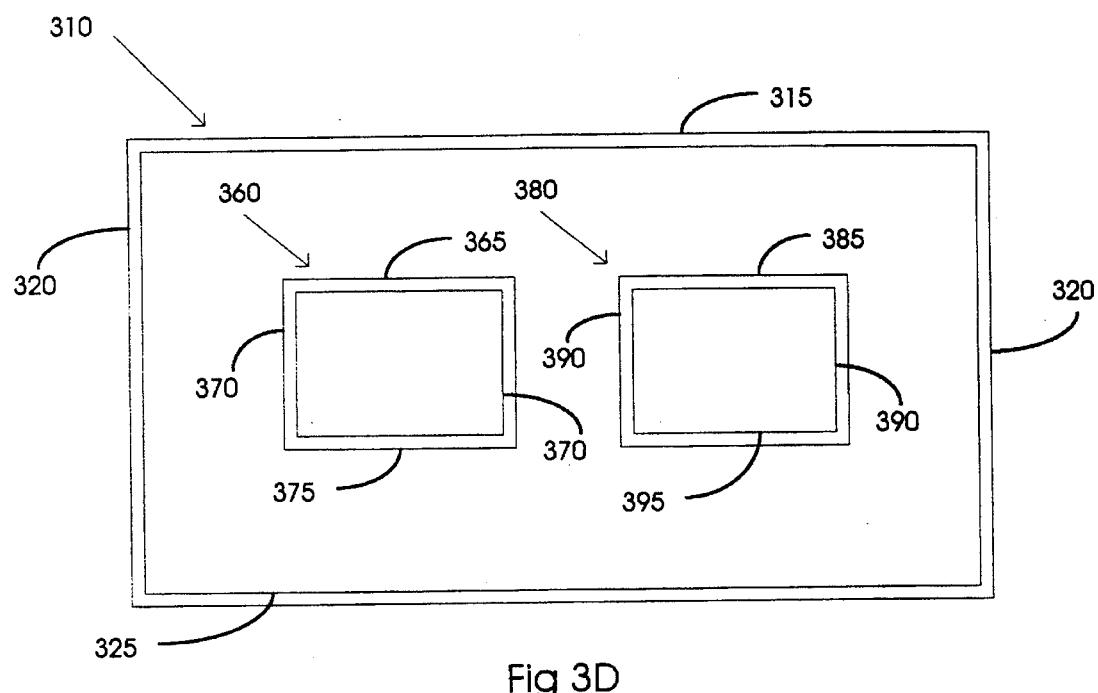

FIG. 3A shows another preferred embodiment of the present invention wherein two inductive circuits, i.e., an outer inductive circuit 310 and and an inner inductive circuit 360 are formed by utilizing the techniques disclosed in the present invention. The outer inductive circuit 310 includes a set of top-inductive lines 315 formed on a top layer and a set of bottom inductive lines 325 formed on a bottom layer. The top-inductive lines 315 and the bottom inductive lines 325 are connected by via-connecting lines 320 penetrating the material between the top layer and the bottom layer. Similarly, the inner inductive circuit 360 also includes a set of top inductive lines 365 formed on an inner top layer, a set of bottom inductive lines 375 formed on an inner bottom layer, and a corresponding set of inner via-connecting lines 370 connecting the inner top inductive lines 365 and the inner bottom-inductive lines 375. The inner bottom layer may be on the same or different horizontal plane as the outer bottom layer depending on the IC technology applied is a three-layer or a four-layer technology. FIG. 3B shows a side cross-sectional view of the inner and outer inductive circuits 360 and 310 where the bottom layers of these two inductive circuits overlap on the same horizontal plane by the use of a three-layer technology. FIG. 3C shows a side cross-sectional view of the inner and outer inductive circuits 360 and 310 where the bottom layers of these two inductive circuits are on two different horizontal planes by the use of a four-layer technology. FIG. 3D shows the side cross-sectional view of another preferred embodiment of the present invention wherein three inductive circuits, i.e., an outer inductive circuit 310 and two inner inductive circuits 360 and 380 are formed by using the techniques disclosed in this invention employing a four layer IC fabrication technology. The outer inductive circuit 310 and the inner inductive circuits 360 and 380 as shown in FIGS. 3A to 3C may be applied for a wide varieties of IC devices including the formation of voltage transformers, with antenna-on-IC-chip, and different filter applications.

Figure 4A:
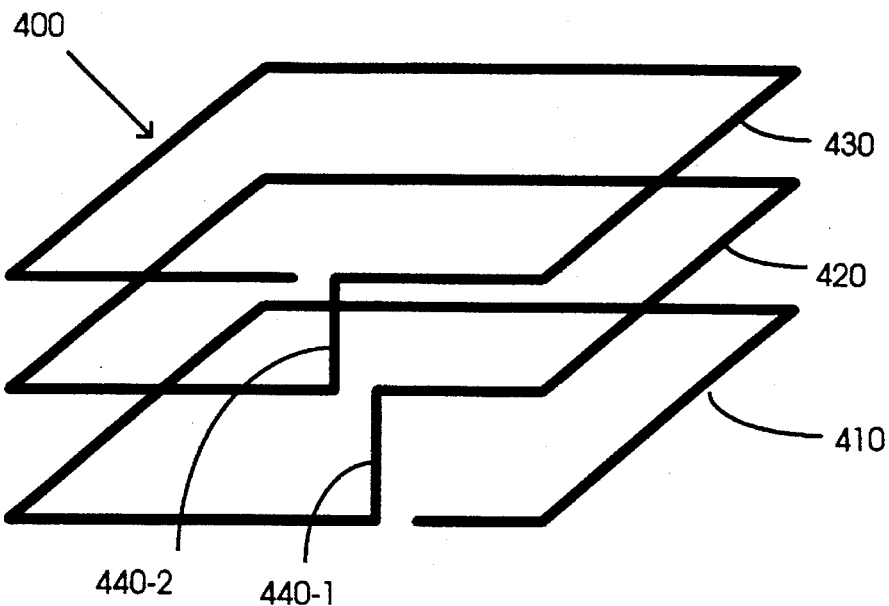
FIGS. 4A to 4C show the partial perspective views of the inductive circuits formed by connecting a plurality of horizontal or vertical coils on several horizontal or vertical planes by using either the via-connecting lines penetrating through several horizontal planes or horizontal connecting lines between several vertical planes.
Figure 4B:
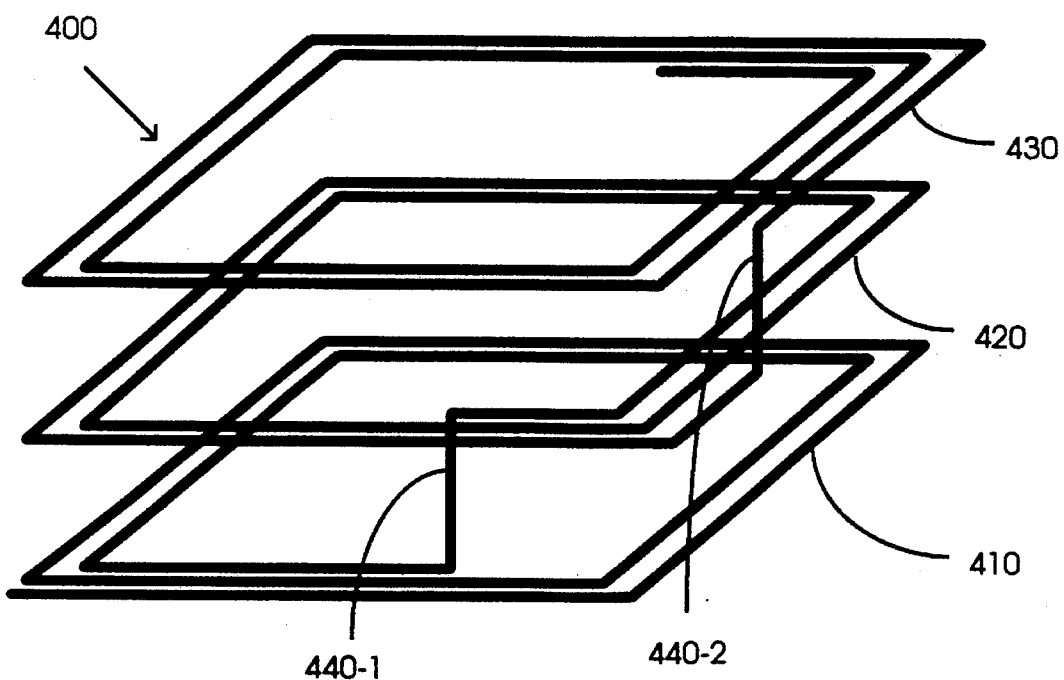

FIGS. 4A and 4B shows another preferred embodiment of the present invention wherein an inductive circuit 400 is formed by connecting a plurality of inductive coils formed on different horizontal planes of an IC chip, i.e., inductive coils 410, 420 and 430, by a plurality of via-connecting lines, i.e., 440-1, 440-2, etc. penetrating the material between these horizontal planes to form a vertical inductive coil 400. As shown in FIGS. 4A and 4B each of the inductive coils on different horizontal planes, i.e., 410, 420 and 430, may be a coil of different shapes and configurations for generating an inductive magnetic field of different magnitudes depending on the intended applications. The vertical inductive circuit 400 may be formed with or without the use of the HMSM as an inductive core depending the application and the magnitude of the inductance required to be generated by such circuits.

Figure 4C:
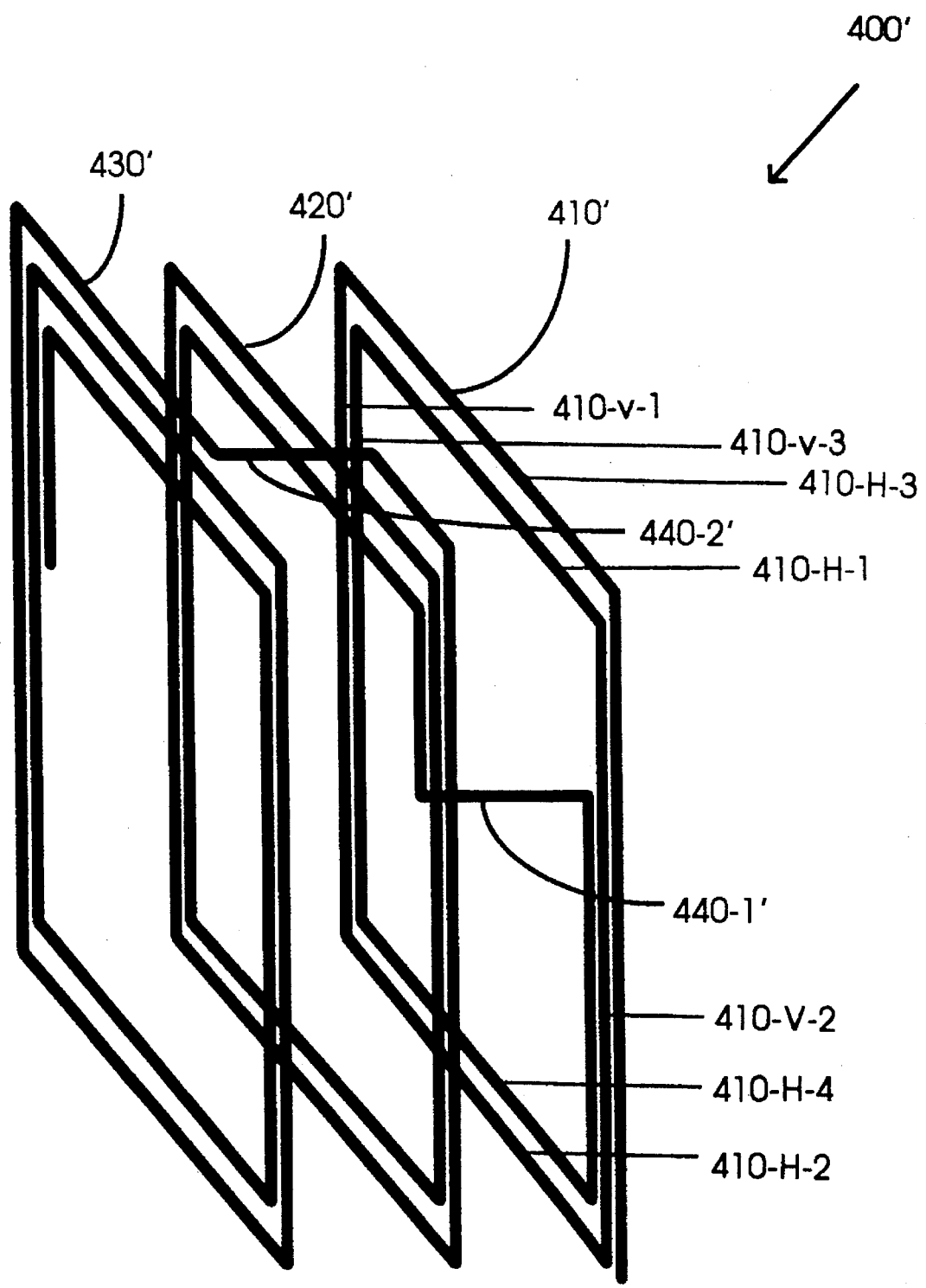

Therefore, FIGS. 4A and 4B show another preferred embodiment of the present invention wherein an integrated-circuit (IC) inductive circuit 400 is fabricated on a semiconductor chip. The IC inductive circuit 400 includes a plurality of inductive coils, i.e., coils 410, 420, 430, each formed on a separate horizontal plane in the semiconductor chip. The inductive circuit 400 further includes a plurality of via-connecting lines, Connecting lines 440-1 and 420-2, each penetrating between the horizontal planes for connecting two of the inductive coils thus forming an combined IC inductive coil in the semiconductor chip. The inductive coils 410, 420, and 430 disposed on several horizontal planes and the plurality of via-connecting lines 440-1 and 440-2 are fabricated by IC processes in the semiconductor chip. The inductive circuits 400 as shown in FIGS. 4A and 4B are vertical inductive coils. Similar inductive circuits can be formed in the horizontal direction as that shown in FIG. 4C wherein inductive coils, i.e., 410', 420', and 430' are formed in several vertical planes. Each of these coils is formed by connecting several conductive lines in different horizontal planes by the use of via-connecting lines penetrating these horizontal planes. For example, the vertical inductive coil 410' is formed by connecting horizontal conductive lines 410-H-1 to 410-H-2 by via-connecting line 410-V-1, horizontal conductive line 410-H-2 to 410-H-3 by via-connecting line 410-V-2, and horizontal conductive line 410-H-3 to 410-H-4 by via-connecting line 410-V-3. A combined inductive circuit 400' is then formed by connecting each of these vertical inductive coils 410', 420' and 430' by horizontal conductive lines 440-1' and 440-2'. Unlike the vertical inductive circuit 400 of FIG. 4B, this combined horizontal inductive circuit 400' can be more flexibly extended in either directions without being limited by the difficulties often encountered in the multiple layer IC processing technology.

The present invention therefore provides a structure and fabrication process of an inductive circuit on an IC chip which is able to overcome the difficulties encountered in the prior art. Specifically, an integrated inductive circuit and fabrication process are taught such that the inductive circuit can be integrated as an IC device since the dimensions of the inductive circuit can now be reduced to a range comparable to the VLSI or ULSI line-widths of approximately one micron or less. Therefore the inductive circuits can be miniaturized and mass produced by the use of IC fabrication processes such that the fabrication quality of the electrical devices which incorporate the inductive circuits can be improved resulting from the use of IC fabrication processes. Furthermore, the present invention also provides an IC structure and fabrication method to integrate an inductive circuit as part of the IC device whereby the performance levels such as the speed, the precision of control or other operational characteristics of the electrical devices which incorporate the inductive circuits can be improved because of the better design and higher fabrication quality provided by the IC technology.

Although the present invention has been described in terms of the presently preferred embodiment, it is to be understood that such disclosure is not to be interpreted as limiting. Various alternations and modifications will no doubt become apparent to those skilled in the art after reading the above disclosure. Accordingly, it is intended that the appended claims be interpreted as covering all alternations and modifications as fall within the true spirit and scope of the invention.

I claim:

1. An integrated-circuit (IC) device includes a plurality of IC circuits integrated on a semiconductor chip, said device comprising:

an inductive circuit including an inductive line formed by connecting a plurality of conductive lines disposed on several layers in said semiconductor chip by utilizing a plurality of lithographically-formed via-connecting lines penetrating between said several layers in said semiconductor chip thus forming an IC inductive coil in said semiconductor chip; and said inductive line disposed on several layers and said plurality of via-connecting lines are fabricated by lithographic processes on said semiconductor chip wherein said line-widths between said inductive lines and said via-connecting lines being substantially in a submicron range whereby said IC inductive circuit are integratable with said plurality of IC circuits of said IC device in a very large scale integrated (VLSI) circuit and ultra large scale integrated (ULSI) circuit.

2. The IC inductive circuit of claim 1 further comprises:

an inductive core composed of high magnetic susceptible material (HMSM); and said IC inductive coil is disposed near said inductive core for conducting an inductive electric current therein for generating an inductive magnetic field in said inductive core.

3. The integrated inductive circuit of claim 1 wherein:

said IC inductive coil as being disposed near said inductive core is disposed inside of said inductive core.

4. The integrated inductive circuit of claim 1 wherein:

said IC inductive coil as being disposed near said inductive core is disposed outside of said inductive core.

5. The integrated inductive circuit of claim 3 wherein:

said IC inductive coil as being disposed inside of said inductive core includes a plurality of bottom-inductive lines disposed on a bottom surface of an intermediate layer inside said inductive core, and a plurality of top-inductive lines disposed on the top surface of said intermediate layer; and said plurality of via-connecting lines further penetrating said intermediate layer for connecting said bottom-inductive lines and said top-inductive lines forming said inductive line surrounding said intermediate layer.

6. The integrated inductive circuit of claim 5 wherein:

said intermediate layer inside said inductive core surrounded by said inductive line is an HMSM layer.

7. The integrated inductive circuit of claim 5 wherein:

said inductive core and said intermediate layer surrounded by said IC inductive coil are both composed of non-conductive HMSM.

8. The integrated inductive circuit of claim 6 wherein:

said inductive core and said intermediate layer surrounded by said IC inductive coil are both composed of conductive HMSM; and said inductive core and said intermediate layer both are insulated from said IC inductive coil.

9. The integrated inductive circuit of claim 4 wherein:

said IC inductive coil as being disposed outside of said inductive core includes a plurality of bottom-inductive lines disposed on a bottom surface of an HMSM layer forming said inductive core, and a plurality of top-inductive lines disposed on the top surface of said HMSM layer; and said plurality of via-connecting lines further penetrating said HMSM layer for connecting said bottom-inductive lines and said top-inductive lines forming said IC inductive coil surrounding said HMSM layer forming said inductive core.

10. The integrated inductive circuit of claim 9 wherein:

said inductive core surrounded by said IC inductive coil is composed of a non-conductive HMSM.

11. The integrated inductive circuit of claim 9 wherein:

said inductive core surrounded by said IC inductive coil is composed of a conductive HMSM; and said inductive core is insulated from said IC inductive coil.

12. The integrated inductive circuit of claim 11 wherein:

said inductive core further includes an insulation layer disposed on said top surface and said bottom surface for insulating said core from said bottom-inductive lines and said top-inductive lines.

13. An integrated-circuit (IC) device includes a plurality of IC circuits integrated on a semiconductor chip, said device comprising:

an inductive circuit including an inductive core composed of high magnetic susceptible material (HMSM);

said inductive circuit including at least an IC inductive coil disposed inside of said inductive core for conducting an inductive electric current therein for generating an inductive magnetic field in said inductive core;

said IC inductive coil further including a plurality of bottom-inductive lines disposed on a bottom surface of an intermediate layer inside said inductive core, and a plurality of top-inductive lines disposed on the top surface of said intermediate layer;

said IC inductive coil further includes a plurality of lithographically-formed via-connecting lines penetrating said intermediate layer for connecting said bottom-inductive lines and said top-inductive lines forming said inductive line surrounding said intermediate layer;

said inductive core, said intermediate layer inside said inductive core surrounded by said IC inductive coil, and said IC inductive coil being arranged such that an electric current being prevented from transmitted in said inductive core and said intermediate layer; and said inductive core and said IC inductive coil being fabricated by IC processes on said IC chip and said inductive line disposed on several layers and said plurality of via-connecting lines are fabricated by lithographic processes on said semiconductor chip wherein said line-widths between said inductive lines and said via-connecting lines being substantially in a submicron range whereby said IC inductive circuit are integratable with said plurality of IC circuits of said IC device in a very large scale integrated (VLSI) circuit and ultra large scale integrated (ULSI) circuit.

14. An integrated-circuit (IC) device includes a plurality of IC circuits integrated on a semiconductor chip, said device comprising:

an inductive circuit including an inductive core composed of high magnetic susceptible material (HMSM);

said inductive circuit including at least an IC inductive coil line disposed outside of said inductive core for conducting an inductive electric current therein for generating an inductive magnetic field in said inductive core;

said IC inductive coil further including a plurality of bottom-inductive lines disposed on a bottom surface of an HMSM layer forming said inductive core, and a plurality of top-inductive lines disposed on the top surface of said HMSM layer;

said IC inductive coil further includes a plurality of lithographically formed via-connecting lines penetrating said HMSM layer for connecting said bottom-inductive lines and said top-inductive lines forming said IC inductive coil surrounding said HMSM layer forming said inductive core;

said inductive core surrounded by said IC inductive coil, and said IC inductive coil being arranged such that an electric current being prevented from transmitted in said inductive core; and said inductive core and said IC inductive coil being fabricated by IC processes on said IC chip and said inductive line disposed on several layers and said plurality of via-connecting lines are fabricated by lithographic processes on said semiconductor chip wherein said line-widths between said inductive lines and said via-connecting lines being substantially in a submicron range whereby said IC inductive circuit are integratable with said plurality of IC circuits of said IC device in a very large scale integrated (VLSI) circuit and ultra large scale integrated (ULSI) circuit.

15. The integrated inductive circuit of claim 14 wherein:

said inductive core further is composed of a conductive HMSM and includes an insulation layer disposed on said top surface and said bottom surface for insulating said core from said bottom-inductive lines and said top-inductive lines.

16. The IC device of claim 1 further comprising:

an internal circuit and a bonding pad disposed on said semiconductor chip and connected to said inductive coil for protecting said inductive circuits and said plurality of IC circuits from being damaged by electric static discharge (ESD) or electric over stress (EOS).

17. An integrated-circuit (IC) device includes a plurality of IC circuits integrated on a semiconductor chip, said device comprising:

an inductive circuit including a plurality of inductive coils each formed on a separate horizontal plane in said semiconductor chip;

said inductive circuit including a plurality of lithographically-formed via-connecting lines each penetrating between said horizontal planes for connecting two of said inductive coils thus forming an combined IC inductive coil in said semiconductor chip; and said inductive coils disposed on several horizontal planes and said plurality of via-connecting lines are fabricated by lithographic processes in said semiconductor chip wherein said line-widths between said inductive coils and said via-connecting lines being substantially in a submicron range whereby said inductive circuit are integratable with said plurality of IC circuits of said IC device in a very large scale integrated (VLSI) circuit and ultra large scale integrated (ULSI) circuit.

18. A method for fabricating an integrated inductive circuit on a semiconductor chip by employing IC fabrication processes comprising the steps of:

(a) applying a lithographic process for patterning a plurality of bottom conductive lines with line widths substantially in a submicron range on said substrate;

(b) forming a medium layer covering said plurality of bottom conductive lines;

(c) applying a lithographic process for patterning a plurality of top conductive lines on top of said medium layer with line widths substantially in said submicron range; and (d) applying a lithographic process for penetrating a plurality of vias in said submicron range through said medium layer and filling said vias with conductive connecting means for connecting each of said top conductive lines to a corresponding bottom conductive line thus forming a continuous inductive circuit surrounding said medium layer wherein said continuous inductive circuit being fabricated with a size suitable for integration in a very large scale integrated (VLSI) circuit and ultra large scale integrated (ULSI) circuit with a plurality of IC circuits on said semiconductor chip.

19. The method for fabricating said integrated inductive circuit of claim 18 wherein:

said step (b) of forming a medium layer including the steps of (b1) forming a bottom dielectric layer on top of said bottom plurality of conductive lines;

(b) forming a high magnetic susceptible material (HMSM) layer on top of said bottom dielectric layer; and (b3) forming a top dielectric layer on top of said HMSM layer whereby said inductive circuit surrounding said medium layer as a core which including a HMSM layer therein.

20. A method for fabricating an integrated inductive circuit on a semiconductor chip by employing IC fabrication processes comprising the steps of:

(a) forming a bottom HMSM layer with a non-conductive HMSM material on top of said substrate;

(b) applying a lithographic process for patterning a plurality of bottom conductive lines with line widths substantially in a submicron range on said bottom HMSM layer;

(c) forming a medium layer covering said plurality of bottom conductive lines;

(d) applying a lithographic process for patterning a plurality of top conductive lines on top of said medium layer with line widths substantially in said submicron range;

(e) applying a lithographic process for penetrating a plurality of vias in said submicron range through said medium layer and filling said vias with conductive connecting means for connecting each of said top conductive lines to a corresponding bottom conductive line thus forming a continuous inductive circuit surrounding said medium layer wherein said continuous inductive circuit being fabricated with a size suitable for integration in a very large scale integrated (VLSI) circuit and ultra large scale integrated (ULSI) circuit with a plurality of IC circuits on said semiconductor chip; and (f) forming a top HMSM layer with a non-conductive HMSM material on top of said top conductive lines whereby said inductive circuit being surrounded by said bottom and said top HMSM layers.

21. An IC device includes a plurality of IC circuits integrated on a semiconductor chip, said device comprising:

an inductive circuit including an outer inductive-coil circuit including a plurality of outer bottom conductive lines formed on an outer bottom layer and a plurality of outer top conductive lines formed on an outer top layer wherein said outer bottom and outer top conductive lines being formed with line widths substantially in a submicron range;

said inductive circuit including an inner inductive-coil circuit including a plurality of inner bottom conductive lines formed on an inner bottom layer and a plurality of inner top conductive lines formed on an inner top layer wherein said inner bottom and inner top conductive lines being formed with line widths substantially in said submicron range;

said inductive circuit including said inner bottom inner layer being the same as said outer bottom layer;

said inductive circuit including a first medium layer formed on top of said inner bottom layer covering said outer bottom conductive lines and said inner bottom conductive lines and supporting said inner top conductive lines thereon;

said inductive circuit including a second medium layer formed on top of said first medium layer covering said inner top conductive lines and supporting said outer top conductive lines thereon; and said inductive circuit including a plurality of lithographically-formed outer vias substantially in a submicron range and lithographically-formed inner vias substantially in a submicron range penetrating said first and second medium layers for connecting said outer top and bottom conductive lines in forming an outer inductive coil and for connecting said inner top and bottom conductive lines in forming an outer inductive coil wherein said inner inductive coil being surrounded by said outer inductive coil, wherein said inner and said outer inductive coils being formed with sizes suitable for integration with said plurality of IC circuits of said IC device in a very large scale integrated (VLSI) circuit and ultra large scale integrated (ULSI) circuit.

22. An IC device includes a plurality of IC circuits integrated on a semiconductor chip, said device comprising:

an inductive circuit including an outer inductive-coil circuit including a plurality of outer bottom conductive lines formed on an outer bottom layer and a plurality of outer top conductive lines formed on an outer top layer wherein said outer bottom and outer top conductive lines being formed with line widths substantially in submicron range;

said inductive circuit including an inner inductive-coil circuit including a plurality of inner bottom conductive lines formed on an inner bottom layer and a plurality of inner top conductive lines formed on an inner top layer wherein said inner bottom and inner top conductive lines being formed with line widths substantially in submicron range;

said inductive circuit including a first medium layer formed on top of said outer bottom layer covering said outer bottom conductive lines and supporting said outer bottom conductive lines thereon;

said inductive circuit including a second medium layer formed on top of said first medium layer covering said inner bottom conductive lines and supporting said inner top conductive lines thereon;

said inductive circuit including a third medium layer formed on top of said second medium layer covering said inner top conductive lines and supporting said outer top conductive lines thereon; and an inductive circuit including a plurality of lithographically-formed outer vias substantially in a submicron range and lithographically-formed inner vias substantially in a submicron range penetrating said first, second and third medium layers for connecting said outer top and bottom conductive lines in forming an outer inductive coil and for connecting said inner top and bottom conductive lines in forming an outer inductive coil wherein said inner inductive coil being surrounded by said outer inductive coil, wherein said inner and said outer inductive coils being formed with sizes suitable for integration with said plurality of IC circuits of said IC device in a very large scale integrated (VLSI) circuit and ultra large scale integrated (ULSI) circuit.

23. The IC device of claim 22 wherein:

said inductive circuit further including a plurality of additional-inner inductive coils formed in parallel to and deposed near said inner inductive coil wherein said additional-inner inductive coils and said inner inductive coil being surrounded by said outer inductive coil therein.

* * * * *